United States Patent [19]

Haluska

[11] Patent Number: 5,290,354
[45] Date of Patent: Mar. 1, 1994

[54] COATINGS FOR MICROELECTRONIC DEVICES AND SUBSTRATES

[75] Inventor: Loren A. Haluska, Midland, Mich.

[73] Assignee: Dow Corning Corporation, Midland, Mich.

[21] Appl. No.: 563,778

[22] Filed: Aug. 7, 1990

Related U.S. Application Data

[62] Division of Ser. No. 480,399, Feb. 15, 1990, Pat. No. 4,973,526.

[51] Int. Cl.$^5$ ............................................. C08K 5/54
[52] U.S. Cl. .................................... 106/479; 106/490; 427/58; 427/419.1; 427/419.2; 427/419.7; 427/419.8; 524/284; 524/356; 524/377; 524/404; 524/405; 524/408; 524/490; 524/484
[58] Field of Search ............... 524/404, 405, 408, 356, 524/377, 284, 490, 484; 106/490, 479; 427/58, 419.1, 419.2, 419.7, 419.8; 556/450, 451

[56] References Cited

U.S. PATENT DOCUMENTS

| | | | |
|---|---|---|---|
| 3,615,272 | 10/1971 | Collins et al. | 23/366 |
| 3,640,093 | 2/1972 | Levene et al. | 65/52 |
| 3,811,918 | 5/1974 | Levene | 65/60 |
| 3,859,126 | 1/1975 | Dietz et al. | 117/169 R |
| 4,460,640 | 7/1984 | Chi et al. | 156/89 |
| 4,472,510 | 9/1984 | January | 501/1 |
| 4,569,921 | 2/1986 | Omori et al. | 501/88 |
| 4,753,855 | 6/1988 | Haluska | 428/702 |
| 4,754,012 | 6/1988 | Yoldas et al. | 427/387 |
| 4,756,977 | 7/1988 | Haluska et al. | 428/702 |
| 4,849,140 | 7/1989 | Wellinghoff et al. | 423/592 |
| 4,859,638 | 8/1989 | Wada et al. | 501/88 |
| 4,885,186 | 12/1989 | Bagley et al. | 427/376.2 |
| 4,929,575 | 5/1990 | Khoury et al. | 501/137 |
| 4,970,097 | 11/1990 | Kalinowski | 427/376.2 |

FOREIGN PATENT DOCUMENTS 63-289939 11/1988 Japan.

*Primary Examiner*—Mark L. Bell
*Assistant Examiner*—Scott L. Hertzog
*Attorney, Agent, or Firm*—Roger E. Gobrogge

[57] ABSTRACT

The present invention relates to a method of forming a ceramic or ceramic-like coating on a substrate, especially electronic devices, as well as the substrate coated thereby. The method comprises coating said substrate with a solution comprising a solvent, hydrogen silsesquioxane resin and a modifying ceramic oxide precursor selected from the group consisting of tantalum oxide precursors, niobium oxide precursors, vanadium oxide precursors, phosphorous oxide precursors and boron oxide precursors. The solvent is then evaporated to thereby deposit a preceramic coating on the substrate. The preceramic coating is then ceramified by heating the to a temperature of between about 40° C. and about 1000° C. This coating, moreover, may be covered by additional passivation and barrier coatings.

3 Claims, No Drawings

COATINGS FOR MICROELECTRONIC DEVICES AND SUBSTRATES

This is a divisional of copending application Ser. No. 07/480,399 filed on Feb. 15, 1990 now U.S. Pat. No. 4,973,526.

FIELD OF INVENTION

This invention relates to the application of ceramic or ceramic-like coatings on substrates such as electronic devices. These coatings comprise materials such as mixed oxides of amorphous silica and a modifying ceramic oxide, silicon, silicon carbide, silicon nitride and silicon carbonitride.

BACKGROUND OF THE INVENTION

Electronic devices, to be serviceable under a wide variety of environmental conditions, must be able to withstand moisture, heat and abrasion, among other stresses. A significant amount of work has been reported directed toward various protective measures to minimize the exposure of these devices to the above conditions and thereby increase their reliability and life. Most of these measures, however, suffer from various drawbacks.

For instance, early measures involved potting electronics within a polymeric resin and, thereby, reducing environmental exposure. These methods proved to be of limited value, however, since most resins are not impermeable to environmental moisture and generally add extra size and weight.

A second method of protection involves sealing the device within a ceramic package. This process has proven to be relatively effective in increasing device reliability and is currently used in select applications. The added size, weight and cost involved in this method, however, inhibits widespread application in the electronic industry.

Recently, the use of lightweight ceramic coatings has been suggested. For instance, Haluska et al. in U.S. Pat. No. 4,756,977, which is incorporated herein in its entirety by reference, discloses silica coatings produced by applying solutions of hydrogen silsesquioxane to an electronic device and then ceramifying by heating to temperatures of 200°–1000° C. This reference also describes the application of other coatings containing silicon carbide, silicon nitride or silicon carbonitride onto the initial silica layer for added protection. The ceramic coatings produced thereby have many desirable characteristics such as microhardness, moisture resistance, ion barrier, adhesion, ductility, tensile strength and thermal expansion coefficient matching which provide excellent protection to the underlying substrate.

Haluska et al. in U.S. Pat. No. 4,753,855 also proposed the application of solutions comprising hydrogen silsesquioxane resin (H-resin) and metal oxide precursors of titanium, zirconium and aluminum to a substrate and pyrolyzing said substrate to temperatures of 200°–1000° C. to form a mixed oxide ceramic coating. This patent, however, fails to teach or suggest the use of metal oxide precursors other than those of titanium, zirconium and aluminum. One skilled in the art would not be able to select other metal oxide precursors based on this disclosure, especially since it is known that the inclusion of certain oxide precursors may be detrimental. For instance, it is known that certain metal oxide precursors may 1) cause gelation of the preceramic mixture (iron oxides, for example): 2) react with the substrate to cause degradation of the preceramic mixture or the substrate (sodium or potassium oxides, for example): or 3) induce stress on the substrate when the oxide precursor expands or contracts upon heating (see, for example, the discussion of Dietz et al infra, column 1, lines 28–62).

Japanese Kokai Patent 63289939 discloses the formation of coating films by hydrolyzing an alkoxysilane or a halogenated silane in a solvent to form a preceramic mixture, applying the preceramic mixture to a substrate and heating at 300° C. or below in an ozone environment. Various glass forming agents including the oxides of boron, phosphorous and tantalum may also be included in the preceramic mixture (page 8, lines 20–23). This reference, however, does not describe the use of hydridosilanes in formation of the preceramic mixture. As such, none of the compounds listed therein could be hydrolyzed and condensed to form H-resin. Moreover, since one skilled in the art readily recognizes the instability of the Si-H bond, it would be expected that materials containing said Si-H bond (such as H-resin) may have different properties (such as solubility and stability) than materials containing the hydrolysis products of the compounds disclosed in the reference.

Dietz et al. in U.S. Pat. No. 3,858,126 teach the formation of a composition comprising 15–60% PbO, 12–40% $B_2O_3$ and 5–45% ZnO, with optionally up to 12% other oxides such as $SiO_2$. This composition is applied to a substrate and pyrolyzed to a temperature less than about 650° C. to form a hermetic coating on said substrate. This reference, however, teaches that the oxides of Pb, B and Zn must be present to be effective and, if $SiO_2$ is included, it must be present in an amount less than 12%.

Levene et al. in U.S. Pat. No. 3,640,093 describe a process of preparing a high purity oxide comprising partially hydrolyzing a silicon alkoxide, reacting the partial hydrolysate with a metal alkoxide and adding a sufficient quantity of water to form a gel. This reference does disclose that the silicon alkoxide may be substituted with hydrogen (Column 1, line 50) and that metal alkoxides similar to those disclosed herein may be utilized (column 1, line 62). This reference, however, (1) discloses that the resultant product is a gel, (2) does not teach coating electronic devices and (3) only provides Examples which show the incorporation of a few metal alkoxides with silicon compounds substituted with 4 functional groups.

Levene in U.S. Pat. No. 3,811,918 teaches the formation of a gel resistant glass precursor composition which may be heated to form a protective glass coating. The coating composition is formed by a method comprising partially hydrolyzing silicon alkoxides (including H-substituted), reacting the partial hydrolysate with an aqueous solution of a metal oxide forming compound, hydrolyzing this solution with additional water and then adding an acid to form a stable, gel-free solution. This reference, however, fails to provide examples wherein a hydridosilicon compound is utilized or examples wherein the multitude of metal oxide precursors disclosed therein are utilized. This reference also requires acid stabilization for stable glass precursor solutions, the application of the preceramic solution to a hot substrate (column 7, lines 7–17), and the use of temperatures above 1000° C. to form the glass coating (see the examples).

The present inventor has unexpectedly found that the oxide precursors of tantalum, vanadium, niobium, boron and/or phosphorous can be mixed with hydrogen silsesquioxane resin to form a soluble preceramic mixture which can be applied to a substrate and pyrolyzed to yield a ceramic or ceramic-like coating on said substrate.

SUMMARY OF THE INVENTION

The present invention relates to a method of forming a ceramic or ceramic-like coating on a substrate, especially electronic devices, as well as the substrate coated thereby. The method comprises coating said substrate with a solution comprising a solvent, hydrogen silsesquioxane resin and a modifying ceramic oxide precursor selected from the group consisting of tantalum oxide precursors, niobium oxide precursors, vanadium oxide precursors, phosphorous oxide precursors and boron oxide precursors. The solvent is then evaporated to thereby deposit a preceramic coating on the substrate. The preceramic coating is then ceramified by heating to a temperature of between about 40° C. and about 1000° C.

The present invention also relates to the formation of additional ceramic or ceramic-like coatings on the coating formed above. In a dual layer system, the second passivation layer may comprise silicon containing coatings, silicon carbon-containing coatings, silicon nitrogen-containing coatings, silicon carbon nitrogen containing coatings or an additional silicon dioxide and modifying ceramic oxide coating. In a triple layer system, the second passivation layer may comprise silicon carbon-containing coatings, silicon nitrogen-containing coatings, silicon carbon nitrogen containing coatings or an additional silicon dioxide and modifying ceramic oxide coating and the third barrier coating may comprise silicon coatings, silicon carbon-containing coatings, silicon nitrogen-containing coatings, and silicon carbon nitrogen containing coatings.

The additional coating layers described above may be deposited using a number of techniques including, but not limited to, chemical vapor deposition, plasma enhanced chemical vapor deposition, metal assisted chemical vapor deposition or ceramification of a preceramic polymer.

The present invention also relates to a composition comprising a solvent, hydrogen silsesquioxane resin and a modifying ceramic oxide precursor selected from the group consisting of tantalum oxide precursors, niobium oxide precursors, vanadium oxide precursors, phosphorous oxide precursors and boron oxide precursors.

DETAILED DESCRIPTION OF THE INVENTION

The present invention is based on the discovery that hydrogen silsesquioxane resin (H-resin) and the oxide precursors of tantalum, vanadium, niobium, boron and phosphorous can be mixed in solution to form a soluble preceramic mixture which can be used to form ceramic or ceramic-like coatings. The resulting coatings are homogenous mixtures of silica and modifying amounts of one or more of the above oxides. Additionally, these coatings can be overcoated with various passivating and/or barrier coatings comprising silicon, silicon carbide, silicon nitride, silicon carbonitride or additional silicon dioxide/modifying ceramic oxide coatings as formed above.

The single and multilayer coatings taught herein are particularly useful in providing protective coatings on electronic devices, electronic circuits or plastics including, for example, polyimides, epoxides, polytetrafluoroethylene and copolymers thereof, polycarbonates, acrylics and polyesters. However, the choice of substrates and devices to be coated by the instant invention is limited only by the need for thermal and chemical stability of the substrate at the temperature and atmosphere utilized in the present invention. The coatings taught herein may also serve as dielectric layers, interlevel dielectric layers, doped dielectric layers to produce transistor like devices, pigment loaded binder systems containing silicon to produce capacitor and capacitor like devices, multilayer devices, 3-D devices, silicon on insulator devices, super lattice devices and the like.

As used in the present invention, the expression "ceramic-like" refers to those pyrolyzed materials which are not fully free of residual carbon and/or hydrogen but which are otherwise ceramic in character: the expression "planarizing coating" refers to a coating which provides a surface barrier layer that is less irregular than the surface prior to application of the coating: and the expressions "electronic device" or "electronic circuit" include, but are not limited to silicon based devices, gallium arsenide based devices, focal plane arrays, opto-electronic devices, photovoltaic cells and optical devices.

The ceramic or ceramic-like coating is formed by a process which comprises coating the substrate with a solution comprising a solvent, H-resin and a modifying ceramic oxide precursor. The solvent is evaporated leaving a preceramic coating deposited on the substrate. The preceramic coating is then ceramified by heating to a temperature of between about 40° to about 1000° C.

Hydrogen silsesquioxane resin is a preceramic polymer represented by the chemical formula $(HSiO_{3/2})_n$ in which n is generally an integer greater than about 10. It can be manufactured by the method of Collins et al. in U.S. Pat. No. 3,615,272 or that of Banks et al. in U.S. Pat. No. 5,010,159, both of which are incorporated herein in their entirety. It has recently been discovered that an especially preferred H-resin may be prepared by the method of Banks et al. supra in which the acid/silane ratio is about 6/1. This preferred H-resin tends to form coatings which are substantially crack-free.

The modifying ceramic oxide precursors included in the present invention include compositions of various metals such as tantalum, niobium and/or vanadium as well as various non-metallic compositions such as those of boron or phosphorous. The expression "modifying ceramic oxide precursor", therefore, is meant to include such metal and non-metal compositions having one or more hydrolyzable groups bonded to the above metal or non-metal. Examples of hydrolyzable groups include, but are not limited to alkoxy, such as methoxy, ethoxy, propoxy etc, acyloxy, such as acetoxy, or other organic groups bonded to said metal or non-metal through an oxygen. These compositions must form soluble solutions when mixed with H-resin and must be capable of being hydrolyzed, and subsequently pyrolyzed, at relatively low temperatures and relatively rapid reaction rates to form modifying ceramic oxide coatings. Such a modifying ceramic oxide precursor is generally present in the preceramic mixture in an amount such that the final ceramic coating contains 0.1 to 30% by weight modifying ceramic oxide.

The solvent to be utilized in the instant invention can be any agent or mixture of agents which will dissolve the H-resin and modifying ceramic oxide precursor without gelation and without interfering with the ceramic coating. These solvents can include, for example, aromatic hydrocarbons such as benzene or toluene, alkanes such as n-heptane or dodecane, ketones, esters or glycol ethers, in an amount sufficient to dissolve the above materials to low solids. For instance, enough of the above solvent can be included to form a 0.1-35 weight % solution.

The H-resin and modifying ceramic oxide precursor may be simply dissolved in the solvent and allowed to stand at room temperature for a time sufficient to allow the modifying ceramic oxide precursor to react into the siloxane structure of the H-resin. Generally, a period of greater than about 2 hours is necessary for said reaction to occur. The solution may then be applied to the substrate as discussed infra. Alternatively, the modifying ceramic oxide precursor may be hydrolyzed or partially hydrolyzed, dissolved in the solution comprising the solvent and the H-resin and then immediately applied to the substrate. Various facilitating measures such as stirring or agitation may be utilized as necessary to produce said solutions.

The preceramic solution may optionally be catalyzed by the simple addition of a platinum or rhodium catalyst which assists in increasing the rate and extent of ceramification. Any platinum or rhodium compound or complex which can be solubilized in this solution will be operable. For instance, an organoplatinum composition such as platinum acetylacetonate or rhodium catalyst $RhCl_3(CH_3CH_2CH_2CH_2S)_3$, obtained from Dow Corning Corporation, Midland, Mich. are all within the scope of this invention. The above catalysts are generally added to the solution in an amount of between about 15 to 200 ppm platinum or rhodium based on the weight of resin in solution.

The preceramic solution is then coated onto the substrate. The method of coating can be, but is not limited to, spin coating, dip coating, spray coating or flow coating.

The solvent in the solution is allowed to evaporate and a preceramic coating thereby deposited. Any suitable means of evaporation may be utilized such as simple air drying by exposure to an ambient environment or the application of a vacuum or mild heat. It is to be noted that when spin coating is utilized, an additional drying period is generally not necessary as the spinning tends to drive off the solvent.

The preceramic coating is ceramified by heating to a temperature of between about 40° to about 1000° C. Generally, for temperatures of between about 40° C. and about 200° C. the coating is heated in the presence of ozone to form the ceramic coating. For temperatures between about 200° C. and about 1000° C., the coating may be heated in ozone or air. However, since the method utilizing ozone usually produces a more rapid, complete ceramification, it is generally preferred. It is also contemplated herein that the coatings be heated in the absence of oxygen to form hermetic coatings on substrates prone to oxidation.

Any method of heating such as the use of a convection oven or radiant or microwave energy is generally functional herein. The rate of heating, moreover, is also not critical, but it is most practical and preferred to heat as rapidly as possible.

In a typical ceramification procedure, the coated substrate may be placed in a convection oven and, if necessary, a continuous flow of ozone introduced. The temperature in the oven is then raised to the desired level (such as about 200° C.) and maintained for the desired time (such as about 0.5-8 hours).

If ozone is to be utilized in this invention, it can be present in any quantity sufficient to enhance ceramification. Generally, concentrations greater than about 0.01 weight percent are effective with larger quantities producing better results.

The ozone used above may be generated by any practical means such as simply exposing oxygen to a source of ultraviolet light. The UV light may come from any source capable of emitting a wavelength in the range of from about 185 to about 200 nm such as, for example, a quartz-mercury lamp. The oxygen source may simply be an ambient atmosphere, but it has been found that enriched oxygen atmospheres or atmospheres of pure oxygen aid in increasing the rate of ceramification.

Alternatively, the ozone may be generated by passing an oxygen source through an ozone generator. Various generators are well known in the art and many are commercially available. The process using an ozone generator is particularly advantageous since a much greater quantity of ozone may be produced. For instance, an ozone generator may produce ozone concentrations up to about 10 weight percent whereas the UV light method is only effective in producing concentrations up to about 0.1 weight percent.

The mechanism whereby ozone decreases the temperature necessary for ceramification has not been fully elucidated but it is believed that ozone enhances the oxidation of the H-resin and modifying ceramic oxide precursor to form the ceramic or ceramic-like coating.

In addition to ozone, water vapor may also be included in the pyrolysis procedure. This inclusion has been shown to further enhance the rate of ozone oxidation.

By the above methods a thin (less than 2 microns) ceramic or ceramic like planarizing coating is produced on the substrate. The coating smooths the irregular surfaces of various substrates and has excellent adhesive properties. In addition, the coating may be covered by other coatings such as further $SiO_2$/modifying ceramic oxide layers, silicon containing coatings, silicon carbon containing coatings, silicon nitrogen containing coatings and/or silicon nitrogen carbon containing coatings.

In a dual layer system, the second passivation layer may comprise silicon containing coatings, silicon carbon-containing coatings, silicon nitrogen-containing coatings, silicon carbon nitrogen containing coatings or an additional silicon dioxide and modifying ceramic oxide coating. In a triple layer system, the second passivation layer may comprise silicon carbon-containing coatings, silicon nitrogen-containing coatings, silicon carbon nitrogen containing coatings or an additional silicon dioxide and modifying ceramic oxide coating and the third barrier coating may comprise silicon coatings, silicon carbon-containing coatings, silicon nitrogen-containing coatings, and silicon carbon nitrogen containing coatings.

The silicon containing coating described above is applied by a method selected from the group consisting of (a) chemical vapor deposition of a silane, halosilane, halodisilane, halopolysilane or mixtures thereof, (b) plasma enhanced chemical vapor deposition of a silane, halosilane, halodisilane, halopolysilane or mixtures thereof, or (c) metal assisted chemical vapor deposition of a silane, halosilane, halodisilane, halopolysilane or mixtures thereof. The silicon carbon coating is applied by a means selected from the group consisting of (1) chemical vapor deposition of a silane, alkylsilane, halosilane, halodisilane, halopolysilane or mixtures thereof in the presence of an alkane of one to six carbon atoms or an alkylsilane, (2) plasma enhanced chemical vapor deposition of a silane, alkylsilane, halosilane, halodisilane, halopolysilane or mixtures thereof in the presence of an alkane of one to six carbon atoms or an alkylsilane or (3) plasma enhanced chemical vapor deposition of a silacyclobutane or disilacyclobutane as further described in U.S. Pat. No. 5,011,706, which is incorporated herein in its entirety. The silicon nitrogen-containing coating is deposited by a means selected from the group consisting of (A) chemical vapor deposition of a silane, halosilane, halodisilane, halopolysilane or mixtures thereof in the presence of ammonia, (B) plasma enhanced chemical vapor deposition of a silane, halosilane, halodisilane, halopolysilane, or mixtures thereof in the presence of ammonia or (C) ceramification of a silicon and nitrogen containing preceramic polymer. The silicon carbon nitrogen-containing coating is deposited by a means selected from the group consisting of (i) chemical vapor deposition of hexamethyldisilazane, (ii) plasma enhanced chemical vapor deposition of hexamethyldisilazane, (iii) chemical vapor deposition of silane, alkylsilane, halosilane, halodisilane, halopolysilane or mixture thereof in the presence of an alkane of one to six carbon atoms or an alkylsilane and further in the presence of ammonia, (iv) plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia and (v) ceramification of a preceramic solution comprising a carbon substituted polysilazane, polysilacyclobutasilazane or polycarbosilane in the presence of ammonia. The silicon dioxide and modifying ceramic oxide coating is applied by the ceramification of a preceramic mixture comprising a silicon dioxide precursor and a modifying ceramic oxide precursor as in the initial coating.

Coatings produced by the instant invention possess low defect density and are useful on electronic devices as protective coatings, as corrosion resistant and abrasion resistant coatings, as temperature and moisture resistant coatings, as dielectric layers in, for instance, multilayer devices and as a diffusion barrier against ionic impurities such as sodium and chloride.

The following non-limiting examples are included so that one skilled in the art may more readily understand the invention.

The hydrogen silsesquioxane resin in the following examples was prepared by the method of Collins et al. in U.S. Pat. No. 3,615,272. The platinum catalyst comprised platinum acetylacetonate in toluene (0.1237% platinum in solution).

EXAMPLE 1

0.45 g of hydrogen silsesquioxane resin, 0.092 g of $Ta(OCH_2CH_3)_5$ and 0.04 g of platinum catalyst (50 ppm platinum based on the amount of H-resin) were dissolved in 3.42 g of n-heptane and 1.0 g n-dodecane by stirring in a flask at room temperature to form a clear, non-gelled solution (10 weight percent solids). The solution was allowed to stand at room temperature for several hours. (FTIR spectra was run on this solution—See Example 6)

5 Motorola 14011B CMOS devices were coated with the above solution and then spun at 3000 rpm for 10 seconds. The devices were heated at 400° C. for 1.5 hours to provide a clear $SiO_2/Ta_2O_5$ coating approximately 2000 angstroms thick. All of the coated CMOS devices were functional.

The above CMOS devices were again coated with the above solution, spun at 3000 rpm for 10 seconds and pyrolyzed at 400° C. for 1.5 hours to form a second $SiO_2/Ta_2O_5$ layer approximately 2000 angstroms thick. The devices were then exposed to continuous salt spray under standard test condition MIL-STD-883C. method 1009.6 and tested in a go-no go test on a Teradyne Analogical Test Instrument J133C. The results are summarized in Table 1.

EXAMPLE 2

0.45 g of hydrogen silsesquioxane resin 0.133 g of $VO(OCH_2CH_2CH_3)_3$, and 0.04 g of platinum catalyst (50 ppm Pt based on the amount of H-resin) were dissolved in 3.15 g of n-heptane and 1.0 g n-dodecane by stirring in a flask at room temperature to form a clear, non-gelled solution, (10 weight percent solids) The solution was allowed to stand at room temperature for several hours. (FTIR spectra was run on this solution—See Example 8)

5 Motorola 14011B CMOS devices were coated with the above solution and then spun at 3000 rpm for 10 seconds. The devices were heated at 400° C. for 3 hours to provide a clear $SiO_2/V_2O_5$ coating approximately 2000 angstroms thick. All of the coated CMOS devices were functional.

The above CMOS devices were again coated with the above solution diluted to 5 weight percent solids (in the same solvent used supra) and spun at 3000 rpm for 10 seconds. The devices were heated at 400° C. for 3 hours to form a second $SiO_2/V_2O_5$ layer approximately 1000 angstroms thick. The devices were then exposed to the same salt spray conditions as Example 1 and tested in a go-no go test on a Teradyne Analogical Test Instrument J133C. The results are summarized in Table 1.

EXAMPLE 3

0.45 g of hydrogen silsesquioxane resin, 0.12 g of $Nb(OCH_2CH_3)_5$, and 0.04 g of platinum catalyst (50 ppm Pt based on the amount of H-resin) were dissolved in 3.43 g of n-heptane and 1.0 g n-dodecane by stirring in a flask at room temperature to form a clear, non-gelled solution. (10 weight percent solids) The solution was allowed to stand at room temperature for several hours. (FTIR spectra was run on this solution—See Example 7)

5 Motorola 14011B CMOS devices were coated with the above solution and then spun at 3000 rpm for 10 seconds. The devices were heated at 400° C. for 3 hours to provide a clear $SiO_2/Nb_2O_5$ coating approximately 2000 angstroms thick. All of the coated CMOS devices were functional.

The above CMOS devices were again coated with the above solution diluted to 5 weight percent solids (in the same solvent used supra) and spun at 3000 rpm for 10 seconds. The devices were heated at 400° C. for 3 hours to apply a second $SiO_2/Nb_2O_5$ layer approximately 1000 angstroms thick. The devices were then exposed to the same salt spray conditions as Example 1 and tested in a go-no go test on a Teradyne Analogical Test Instrument J133C. The results are summarized in Table 1.

EXAMPLE 4

0.45 g of hydrogen silsesquioxane resin, 0.15 g of $B_3(OCH_3)_3O_3$, and 0.04 g of platinum catalyst (50 ppm Pt based on the amount of H-resin) were dissolved in 3.40 g of n-heptane and 1.0 g n-dodecane by stirring in a flask at room temperature to form a clear, non-gelled solution. (10 weight percent solids) The solution was allowed to stand at room temperature for several hours.

5 Motorola 14011B CMOS devices were coated with the above solution and then spun at 3000 rpm for 10 seconds. The devices were heated at 400° C. for 3 hours to provide a clear $SiO_2/B_2O_3$ coating approximately 2000 angstroms thick. All of the coated CMOS devices were functional.

The above CMOS devices were again coated with the above solution diluted to 5 weight percent solids (in the same solvent used supra) and spun at 3000 rpm for 10 seconds. The devices were heated at 400° C. for 3 hours to form a second $SiO_2/B_2O_3$ layer approximately 1000 angstroms thick. The devices were then exposed to the same salt spray conditions as Example 1 and tested in a go-no go test on a Teradyne Analogical Test Instrument J133C. The results are summarized in Table 1.

EXAMPLE 5

0.45 g of hydrogen silsesquioxane resin. 0.076 g of $P(OCH_2CH_3)_3O$, and 0.04 g of platinum catalyst (50 ppm Pt based on the amount of H-resin) were dissolved in 3.57 g of n-heptane and 1.0 g n-dodecane by stirring in a flask at room temperature to form a clear solution. (10 weight percent solids) The solution was allowed to stand at room temperature for several hours.

5 Motorola 14011B CMOS devices were coated with the above solution and then spun at 3000 rpm for 10 seconds. The devices were heated at 400° C. for 3 hours to provide a clear $SiO_2/P_2O_5$ coating approximately 2000 angstroms thick. All of the coated CMOS devices were functional.

The above CMOS devices were again coated with the above solution diluted to 5 weight percent solids (in the same solvent used supra) and spun at 3000 rpm for 10 seconds. The devices were heated at 400° C. for 3 hours to form a second $SiO_2/P_2O_5$ layer approximately 1000 angstroms thick. The devices were then exposed to the same continuous salt spray as Example 1 and tested in a go-no go test on a Teradyne Analogical Test Instrument J133C. The results are summarized in Table 1.

EXAMPLE 6

The solution prepared in Example 1 was coated on a Motorola 14011B CMOS device and a silicon wafer and each spun at 3000 rpm for 11 seconds. FTIR spectra of the coating on the wafer showed strong bands at 870 $cm^{-1}$ and 2245 $cm^{-1}$, indicating the presence of Si-H, and a strong band at 1062 $cm^{-1}$, indicating the presence of Si-O bonds.

The device and the silicon wafer were heated at 250° C. for 5.5 hours in the presence of ozone and UV light to provide clear $SiO_2/Ta_2O_5$ coatings approximately 2000 angstroms thick. FTIR spectra of the pyrolyzed coating on the silicon wafer showed a broad band at 1062 $cm^{-1}$ (Si-O) and nearly complete absence of bands for SiH.

The above CMOS device was again coated with the above solution diluted to 5 weight percent solids (in the same solvent used supra) and spun at 3000 rpm for 11 seconds. The device was heated at 250° C. for 5.5 hours in the presence of ozone and UV light to form a second SiO layer approximately 1000 angstroms thick. The device was tested in a go-no go test on a Teradyne Analogical Test Instrument J133C and passed the test.

EXAMPLE 7

The solution prepared in Example 3 was coated on a Motorola 14011B CMOS device and a silicon wafer and each spun at 3000 rpm for 11 seconds. FTIR spectra of this coating on the silicon wafer showed strong bands at 870 $cm^{-1}$ and 2245 $cm^{-1}$, indicating the presence of Si-H, and a strong band at 1062 $cm^{-1}$, indicating the presence of Si-O.

The device and wafer were heated at 250° C. for 5.5 hours in the presence of ozone and UV light to provide a clear $SiO_2/Nb_2O_5$ coating approximately 2000 angstroms thick. FTIR spectra of the pyrolyzed coating on the silicon wafer showed a broad band at 1062 $cm^{-1}$ (Si-O) and nearly complete absence of the bands for SiH.

The above CMOS device was again coated with the above solution diluted to 5 weight percent solids (in the same solvent used supra) and spun at 3000 rpm for 11 seconds. The device was heated at 250° C. for 5.5 hours in the presence of ozone and UV light to form a second $SiO_2/Nb_2O_5$ layer approximately 1000 angstroms thick. The device was tested in a go-no go test on a Teradyne Analogical Test Instrument J133C and passed the test.

EXAMPLE 8

The solution prepared in Example 2 was coated on a Motorola 14011B CMOS device and a silicon wafer and each spun at 3000 rpm for 11 seconds. FTIR spectra of this coating on the silicon wafer showed strong bands at 870 $cm^{-1}$ and 2245 $cm^{-1}$, indicating the presence of Si-H, and a strong band at 1062 $cm^{-1}$, indicating the presence of Si-O.

The device and the silicon wafer were heated at 250° C. for 5.5 hours in the presence of ozone and UV light to provide a clear $SiO_2/V_2O_5$ coating approximately 2000 angstroms thick. FTIR spectra of the heated coating on the silicon wafer showed a broad band at 1062 $cm^{-1}$ (Si-O) and nearly complete absence of bands for SiH.

The above CMOS device was again coated with the above solution diluted to 5 weight percent solids (in the same solvent used supra) and spun at 3000 rpm for 11 seconds. The device was heated at 250° C. for 5.5 hours in the presence of ozone and UV light to form a second $SiO_2/V_2O_5$ layer approximately 1000 angstroms thick. The device was tested in a go-no go test on a Teradyne Analogical Test Instrument J133C and passed the test.

TABLE 1

| SALT SPRAY RESISTANCE OF COATED CMOS DEVICES | |
| --- | --- |
| EXAMPLE | RESULTS |
| 1 | 5 of 5 passed 6 hours |
|   | 4 of 5 passed 8 hours |
|   | 2 of 5 passed 10 hours |
|   | 1 of 5 passed 18 hours |
| 2 | 4 of 5 passed 2 hours |
|   | 3 of 5 passed 4 hours |

TABLE 1-continued

| SALT SPRAY RESISTANCE OF COATED CMOS DEVICES | |
| --- | --- |
| EXAMPLE | RESULTS |
| 3 | 2 of 5 passed 10 hours |
|  | 1 of 5 passed 76 hours |
|  | 4 of 5 passed 4 hours |
|  | 3 of 5 passed 10 hours |
|  | 2 of 5 passed 14 hours |
|  | 1 of 5 passed 16 hours |
| 4 | 3 of 5 passed 2 hours |
| 5 | 3 of 5 passed 2 hours |
|  | 2 of 5 passed 4 hours |
|  | 1 of 5 passed 44 hours |
| Uncoated Control | fails after 5–10 minutes |

What is claimed is:

1. A homogenous liquid composition comprising a solvent, hydrogen silsesquioxane resin and a modifying ceramic oxide precursor selected from the group consisting of tantalum oxide precursors, niobium oxide precursors, vanadium oxide precursors, phosphorous oxide precursors and boron oxide precursors, wherein said solution contains between about 0.1 and about 35 weight percent solids of hydrogen silsesquioxane and modifying ceramic oxide precursor and said modifying ceramic oxide precursor is present in an amount such that upon heating to a temperature in the range of between about 40° and about 1000° C., the final ceramic coating contains between about 0.1 and about 30 weight percent modifying ceramic oxide.

2. The composition of claim 1 wherein the solvent is selected from the group consisting of aromatic hydrocarbons, alkanes, ketones, esters and glycol ethers.

3. The composition of claim 2 wherein a platinum or rhodium catalyst is additionally present in said solution in an amount of between about 15 and about 200 ppm platinum based on the weight of hydrogen silsesquioxane.

* * * * *